US006806904B1

(12) United States Patent
Kim

(10) Patent No.: US 6,806,904 B1
(45) Date of Patent: Oct. 19, 2004

(54) SOLID-STATE IMAGE PICKUP DEVICE

(75) Inventor: Yong Gwan Kim, Kurokawa-gun (JP)

(73) Assignee: Fuji Photo Film Co., Ltd., Nakanuma (JP)

( * ) Notice: Subject to any disclaimer, the term of this patent is extended or adjusted under 35 U.S.C. 154(b) by 809 days.

(21) Appl. No.: 09/639,876

(22) Filed: Aug. 17, 2000

(30) Foreign Application Priority Data

Aug. 18, 1999 (JP) ............................................. 11-231998

(51) Int. Cl.⁷ ....................... H04N 5/335; H01L 27/148
(52) U.S. Cl. ..................................... 348/315; 257/232
(58) Field of Search .......................... 348/315; 257/232, 257/233

(56) References Cited

U.S. PATENT DOCUMENTS 4,558,365 A * 12/1985 Ochi .......................... 348/275
4,884,143 A * 11/1989 Uya ............................ 348/315
5,340,766 A *  8/1994 Nakashiba ................... 438/60
6,236,434 B1 *  5/2001 Yamada ....................... 348/315

OTHER PUBLICATIONS

Wide dynamic range HDTV Image sensor with aliasing suppression: Nishida et al. ( IEEE Transactions on Consumer electronics).*

* cited by examiner

*Primary Examiner*—Tuan Ho
*Assistant Examiner*—Yogesh Aggarwal
(74) *Attorney, Agent, or Firm*—Arent Fox PLLC

(57) ABSTRACT

A solid-state image pickup device in which many photoelectric converters are arranged in a shifted-pixel layout includes a vertical charge transfer path whose width is larger in a region in which an isolation area is disposed on both sides of the transfer path than in a region in which the isolation area is arranged on only one side thereof. This prevents an event in which the transfer efficiency and the saturation output of charge in the vertical charge transfer path are locally changed by the narrow channel effect.

17 Claims, 9 Drawing Sheets

US 6,806,904 B1

SOLID-STATE IMAGE PICKUP DEVICE

This application is based on Japanese Patent Application HEI 11-231998 filed on Aug. 18, 1999, the entire contents of which are incorporated herein by reference.

BACKGROUND OF THE INVENTION a) Field of the Invention

The present invention relates to a solid-state image pickup device, and in particular, to a structure of a vertical charge transfer path of a solid-state image pickup device.

b) Description of the Related Art

FIG. 9 generally shows a solid-state image pickup device in a plan view.

The configuration of FIG. 9 includes a solid-state image pickup device 100 including a semiconductor substrate 101 and a large number of pixels 103 arranged in a matrix (i.e., in rows and columns). Each pixel 103 includes a photodiode (a photoelectric converter or transducer element) 103a, a readout gate or a transfer gate 103b.

For each column of pixels, a vertical charge transfer path 105 is formed. Each path 105 includes a layer of a semiconductor of first conductivity type (n-type). The readout gate 103b is disposed between each photodiode 103a and the first-conductivity-type semiconductor layer. The first-conductivity-type (n-type) semiconductor layer is used as a charge transfer channel. The configuration further includes a horizontal charge transfer path 107 and an amplifier 111.

Each vertical charge transfer path 105 includes an end electrically connected to the horizontal charge transfer path 107. The horizontal path 107 includes an end connected to the amplifier 111.

The photodiode 103a generates an electric signal (electric charge) through photoelectric conversion. The signal or charge is transferred via the readout gate 103b to the vertical charge transfer path 105. The charge is vertically transferred through the path 105, for example, by four-phase driving and is delivered to the horizontal charge transfer path 107. In the path 107, the charge is transferred to the amplifier 111, for example, by two-phase driving. The amplifier 111 amplifies the electric signal thus transferred and outputs information of an image to an external device.

The solid-state image pickup device 100 includes a field area or zone 117 other than the areas in which the constituent components such as the photodiodes 103a, the readout gates 103b, the vertical charge transfer paths 105, the horizontal charge transfer paths 107, and the output amplifier 111 are disposed.

In this structure, it is desirable to prevent surmounting of electrons over, for example, areas (1) to (3), listed below, in the field area 117. This is because the surmounting of electrons possibly causes an erroneous operation in the image pickup device 100.

(1) An area other than the readout gate 103b in an area between the photodiode 103a and the associated vertical charge transfer path 105 (first areas 121a and 121b of FIG. 9).

(2) An area between the vertical charge transfer path 105 and the photodiode 103a which is not connected by the readout gate 103b to the path 105 and which is horizontally next to the path 105 (a second are 125 of FIG. 9).

(3) An area between vertically adjacent photodiodes 103a among the photodiodes 103a connected via the readout gate 103b to the vertical charge transfer path 105 (a third area 131 of FIG. 9).

To prevent the erroneous operation above, there is formed, in a periphery of the first-conductivity-type (n-type) semiconductor layer of each vertical charge transfer path 105 in a plan view, an isolation area rib or zone such as a channel stop area in other than the areas in which the readout gates 103b are arranged. Similarly, between the photodiodes 103a sequentially arranged in a direction of the pixel column, an isolation area such as a channel stop area is disposed.

When the image pickup devices 100 has a pixel density not exceeding a particularly large value, distance between the photodiodes 103a in the first to third areas 121, 125, and 131 or distance between the photodiodes 103a and the vertical charge transfer path 105 therein can be set to a fully great value. Namely, the isolation areas having a sufficient width can be manufactured in these areas 121, 125, and 131. Consequently, there exists little fear of the erroneous operation above.

However, with increase in the pixel density of solid-state image pickup devices in recent years, it is difficult to take such satisfactorily long distance, for example, between the photodiodes 103a or between the photodiodes 103a and the vertical charge transfer path 105 in the first to third areas 121, 125, and 131. The isolation area cannot have sufficient width in the areas 121, 125, and 131.

In a case in which the isolation area is formed by a channel stop area, the electric isolation can be desirably obtained by increasing an impurity concentration of the channel stop area even if width thereof is reduced to a relatively narrow value.

However, when the impurity concentration is increased in the channel stop area, narrow channel effect easily occurs in a place where the channel stop area is disposed on both sides in a direction of width of the first-conductivity-type (n-type) semiconductor layer of the vertical charge transfer path. The narrow channel effect then locally changes a transfer efficiency and a saturation output of charge in the vertical charge transfer path. It is therefore difficult to transfer charge to the horizontal charge transfer path in a stable state.

Particularly, the narrow channel effect easily appears in a solid-state image pickup device including a shifted-pixel layout, which no expected as a structure to cope with high pixel density.

SUMMARY OF THE INVENTION

It is therefore an object of the present invention to provide a solid-state image pickup device capable of solving the problem associated with increase in the pixel density.

According to one aspect of the present invention, there is provided a solid-state image pickup device, comprising: a semiconductor substrate having a two-dimensional surface; a large number of photoelectric converter elements including a semiconductor region of first conductivity type, said photoelectric converter elements being arranged on the surface of said semiconductor substrate in a plurality of columns with a fixed pitch and a plurality of rows with a fixed pitch, said photoelectric converter elements in each odd column being shifted about one half of the pitch in each said column relative to said photoelectric converter elements in each even column, said photoelectric converter elements in each odd row being shifted about one half of the pitch in each said row relative to said photoelectric converter elements in each even row, each said photoelectric converter element column including said photoelectric converter elements of only said odd rows or said even rows; a plurality of isolation areas each formed on the surface of said semiconductor substrate between each pair of adjacent ones of said photoelectric converter element columns, each said isolation area including a semiconductor layer of second conductivity type generally extending in a direction of said photoelectric converter element column, while locally meandering; and a plurality of vertical charge transfer paths each formed between each said photoelectric converter element column and adjacent one of said isolation areas on one side of said photoelectric converter element column in a direction of said photoelectric converter element row, each said vertical charge transfer path including a semiconductor layer of first conductivity type generally extending in said photoelectric converter element column direction, while locally meandering, said vertical charge transfer path having width $W_1$ between each said photoelectric converter element of said column and said adjacent isolation area and width $W_2$ between said photoelectric converter elements adjacent to each other in said column, said width $W_2$ being larger than said width $W_1$.

According to another aspect of the present invention, there is provided a solid-state image pickup device, comprising: a semiconductor substrate having a two-dimensional surface; a large number of photoelectric converter elements arranged on the surface of said semiconductor substrate in a plurality of columns with a first pitch and a plurality of rows with a second pitch, said photoelectric converter elements in each odd column being shifted about one half of the second pitch relative to said photoelectric converter elements in each even column, said photoelectric converter elements in each odd row being shifted about one half of the first pitch relative to said photoelectric converter elements in each even row, each said photoelectric converter element column including said photoelectric converter elements of only said odd rows or said even rows; an isolation area formed on said semiconductor substrate on a predetermined first side of each associated photoelectric converter element column, said isolation area generally extending, while locally meandering, in a direction of said photoelectric converter element column; and a vertical charge transfer path including a semiconductor layer of first conductivity type formed on said semiconductor substrate on a second side of each associated photoelectric converter element column, the second side being opposite to the first side, said semiconductor layer generally extending, while locally meandering, in a direction of said photoelectric converter element column, and being contiguous, in every regions between adjacent two of said photoelectric converter elements in said associated photoelectric converter element column, to said isolation area for the associated column while being contiguous to another said isolation area for the column next to the associated column on the second side, said semiconductor layer having width $W_1$ in a section in which said semiconductor layer is contiguous only to said another isolation area on the second side and width $W_2$ in a section in which said semiconductor layer is contiguous to said isolation area on the first side and said another isolation area on the second side, said width $W_2$ being larger than said width $W_1$.

By selecting the width of the first-conductivity-type (n-type) semiconductor layer constituting the vertical charge transfer path as up above, the disadvantageous event in which the narrow channel effect locally changes the transfer efficiency and the saturation output of charge in the vertical charge transfer path can be suppressed.

The width (to be referred to as an "effective vertical charge transfer path width" in this specification) of the area which can function, when an operating voltage is applied to the solid-state image pickup device, as an actual charge transfer path in each vertical charge transfer path can be substantially kept a constant value in a plan view. Electric charge can be accordingly transferred by each vertical charge transfer path in a stable state.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
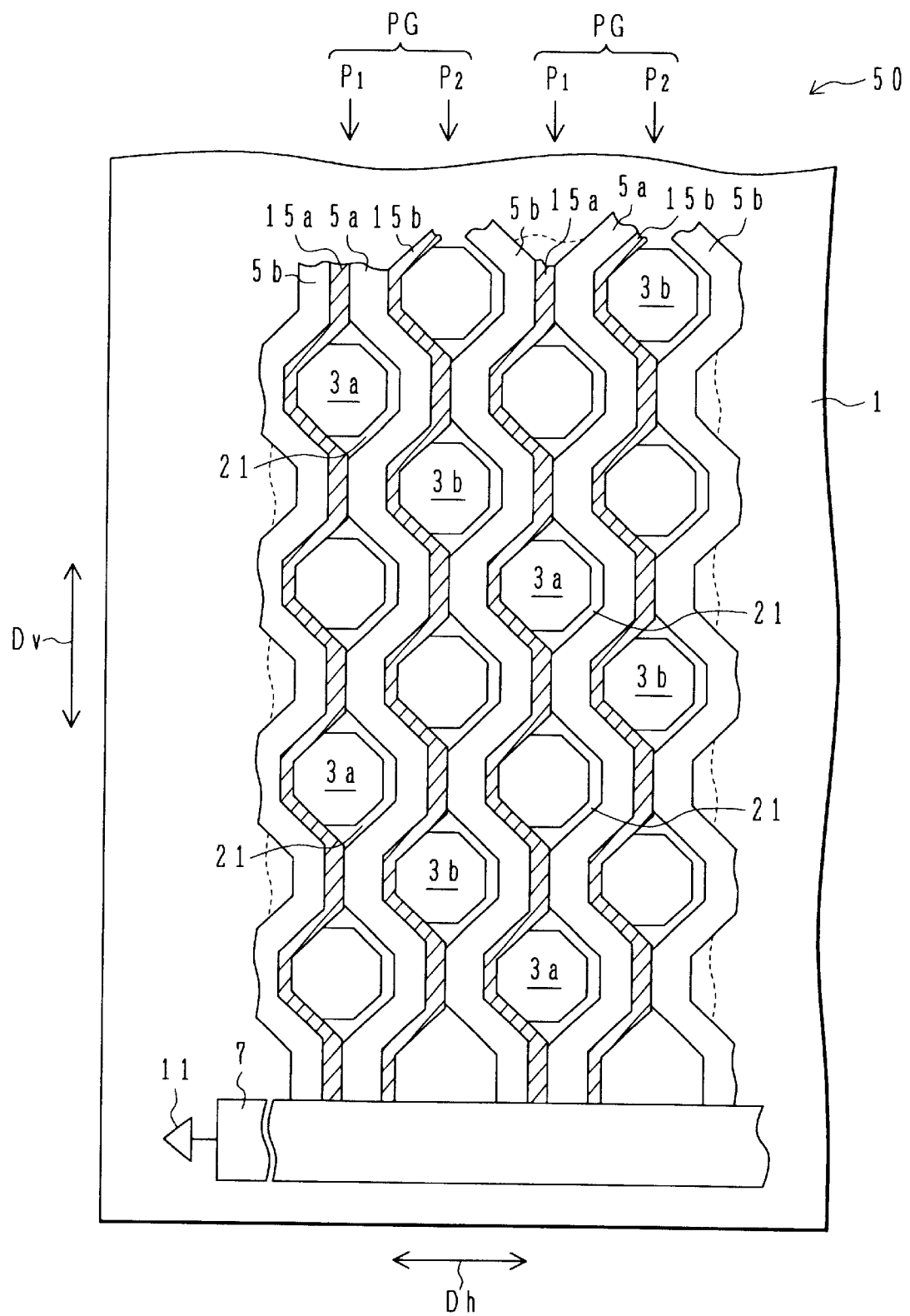
FIG. 1 is a plan view schematically showing a solid-state image pickup device according to a first embodiment.

FIG. 1 illustratively shows a solid-state image pickup device according to a first embodiment.

The configuration of FIG. 1 includes a solid-state image pickup device 50 including a semiconductor substrate 1 and photodiodes (photoelectric converters) 3a and 3b formed thereon in a shifted-pixel layout including a plurality of rows and a plurality of columns.

Specifically, a first pixel column P1 and a second pixel column P2 are alternately arranged. The first pixel column P1 includes a plurality of photodiodes (photoelectric converters) 3a aligned in a vertical direction Dv (a direction of columns of photoelectric converters) and the second pixel column P2 includes a plurality of photodiodes (photoelectric converters) 3b which are adjacent to the first pixel column P1 in a horizontal direction Dh (a direction of rows of photoelectric converters) and which are shifted by a half pitch in the vertical direction Dv. One pitch is defined by a distance between center points respectively of two photodiodes 3a adjacent to each other in the vertical direction Dv or a distance between center points respectively of two photodiodes 3b adjacent to each other in the vertical direction Dv. These distances are ordinarily equal to each other.

In this regard, the photodiode 3a in the first pixel column P1 and the associated photodiode 3b in the second pixel column P2 are not necessarily shifted by a half pitch. These photodiodes 3a and 3b may be shifted by about a half pitch.

In this specification, "about a half pitch" indicates not only "a half pitch" but also a value which is not equal to a half pitch due to a manufacturing error, a rounding error of a position of a photodiode in association with a design and/or a mask production and which can be regarded substantially as equivalent to a half pitch in relation to performance of a solid-state image pickup device produced and quality of images generated by the device.

One first pixel column P1 and one second pixel column P2 adjacent thereto on the right side in the horizontal direction Dh form one group of pixels PG. A large number of such pixel groups PG are disposed in the horizontal direction Dh.

Each of the photodiodes 3a and 3b has a shape of almost a TD regular octagon in a plan view. The photodiodes 3a and 3b each include an n-type (first-conductivity-type) semiconductor region to serve as a charge storage area and a $p^+$-type (second-conductivity-type) semiconductor region fabricated thereon.

For each first pixel column P1, a vertical charge transfer path 5a is manufactured on the right side thereof. Each vertical charge transfer path 5a generally extends, while locally meanders in a zigzag manner, in a vertical direction Dv, between the photodiodes 3a of the associated first pixel column P1 and the photodiodes 3b of the second pixel column P2 adjacent thereto on the right side.

Similarly, for each second pixel column P2, a vertical charge transfer path 5b is fabricated on the right side thereof. Each vertical charge transfer path 5b generally extends, while locally meanders, in a vertical direction Dv, between the photodiodes 3b of the associated second pixel column P2 and the photodiodes 3a of the first pixel column P1 adjacent thereto on the right side.

Each of the vertical charge transfer paths 5a and 5b includes an n-type (first-conductivity-type) semiconductor layer formed on the semiconductor substrate 1. These n-type (first-conductivity-type) semiconductor layers generally extend, while locally meander along the associated photoelectric converter columns, in the vertical direction Dv. These n-type (first-conductivity-type) semiconductor layers serve as charge transfer channels.

Supplied to one vertical charge transfer path 5a is charge read only from the photodiodes of the associated first or second pixel column P1 or P2.

On the right side of each photodiode 3a or 3b, there is formed one readout gate region 21. Each readout gate region 21 is brought into contact with one photodiode 3a or 3b and a vertical charge transfer path 5a or 5b corresponding to the photodiode 3a or 3b. Each readout agate region 21 includes a p-type (second-conductivity-type) semiconductor layer. The p-type semiconductor layer has a p-type impurity concentration lower than that of the $p^+$-type semiconductor region constituting the photodiode.

Formed along the photoelectric converter column of the first pixel column P1 is an isolation area 15a. Along the photoelectric converter column of the second pixel column P2, an isolation area 15b is manufactured. Each of the isolation areas 15a and 15b generally extends, while locally meanders, on the left side of the associated photoelectric converter column in the column direction.

Each vertical charge transfer path 5a is contiguous to an isolation area 15b corresponding to a photoelectric converter column (second pixel column P2) next to the path 5a on the right side. The isolation area 15b electrically isolate each photodiode 3b of the associated second pixel column P2 from a vertical charge transfer path 5a being contiguous to the isolation area 15b on the left side.

Similarly, each vertical charge transfer path 5b is contiguous to an isolation area 15a corresponding to a photoelectric converter column (first pixel column P1) adjacent to the path 5b on the right side. The isolation area 15a electrically isolates each photodiode 3a of the associated first pixel column P1 from a vertical charge transfer path 5b being contiguous to the isolation area 15a on the left side.

Each of the isolation areas 15a and 15b is hatched in FIG. 1. These isolation areas 15a and 15b include a p-type (second-conductivity-type) semiconductor layer having a p-type impurity concentration higher than that of the readout gate region 21.

Each of the vertical charge transfer paths 5a and 5b has an end electrically connected to the horizontal charge transfer path 7. The path 7 includes a charge-coupled device of, for example, two-phase drive type.

The path 7 has an end connected to an output amplifier 11.

Figure 2:
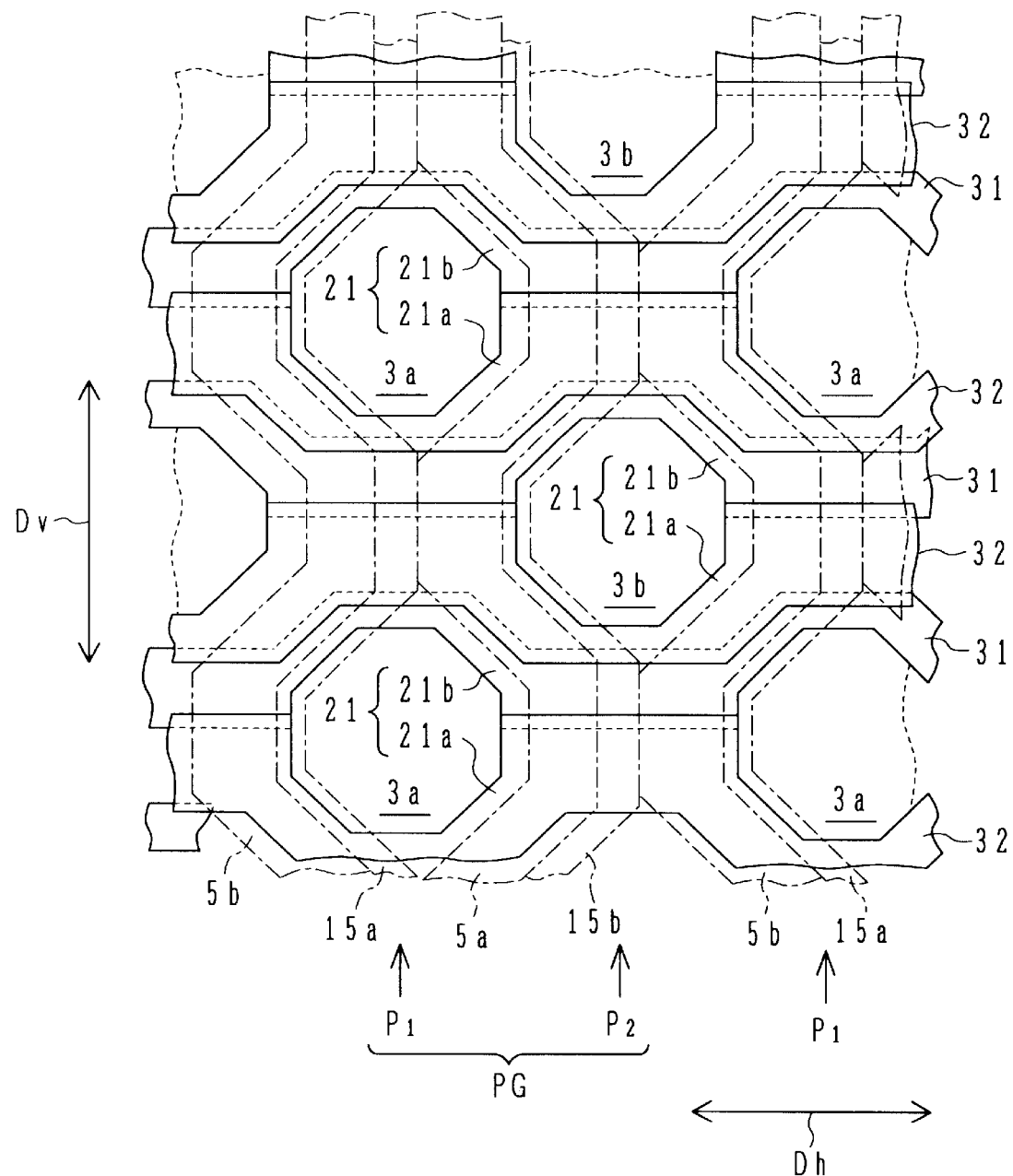
FIG. 2 is a magnified plan view schematically showing a primary section of the solid-state image pickup device of the first embodiment.
Figure 3:
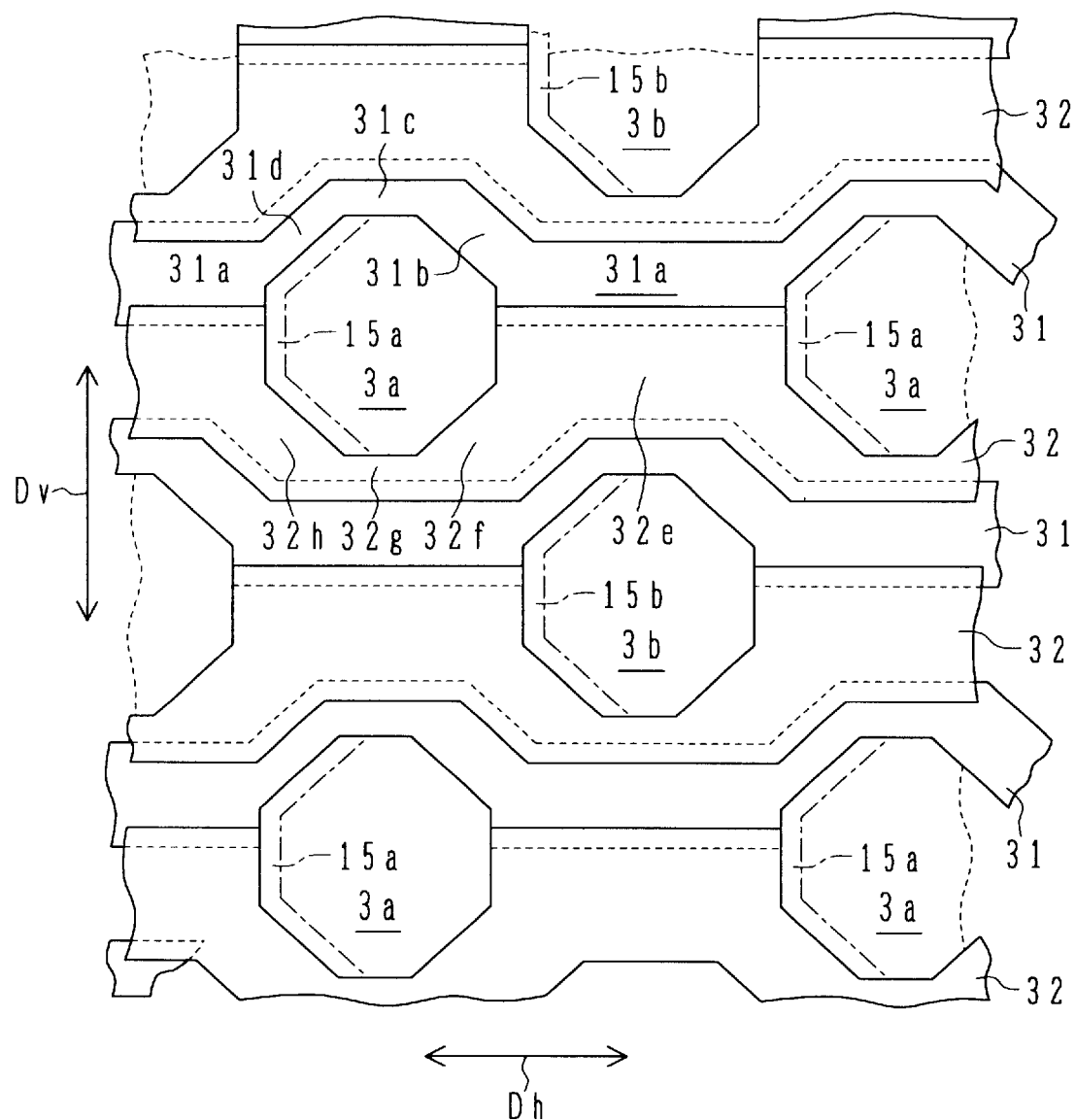
FIG. 3 is a plan view schematically showing arrangement of vertical charge transfer electrodes in the solid-state image pickup device of the first embodiment.
Figure 4:
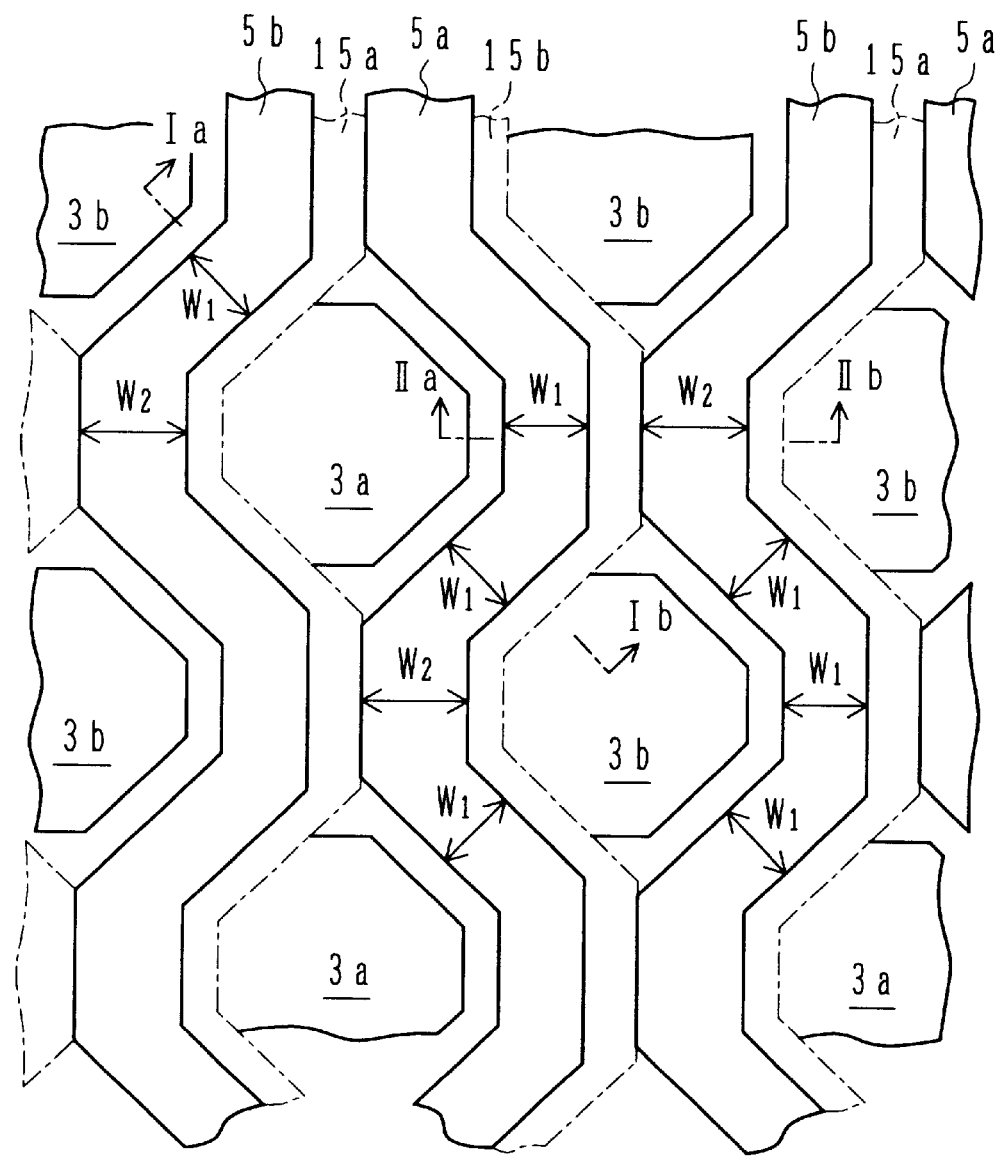
FIG. 4 is a plan view schematically showing arrangement of vertical charge transfer paths and isolation areas in the solid-state image pickup device of the first embodiment.

FIGS. 2 to 4 are plan views showing enlarged images of main sections of the solid-state image pickup device 50 shown in FIG. 1.

FIG. 2 schematically shows in a plan view a layout of constituent components shown in FIG. 1 and first and second vertical transfer electrodes 31 and 32. In FIG. 2, chain lines indicate contours of regions of the vertical charge transfer paths 5a and 5b and isolation areas 15a and 15b.

FIG. 3 is a plan view showing a layout of the first and second vertical transfer electrodes 31 and 32.

FIG. 4 shows in a schematic plan view a layout of the vertical charge transfer paths 5a and 5b and the isolation areas 15a and 15b formed on the semiconductor substrate 1.

In the following description, a plurality of photodiodes arranged in a row in the horizontal direction will be collectively called one pixel row for convenience of explanation. The solid-state image pickup device 50 includes a plurality of pixel rows.

As can be seen from FIGS. 2 and 3, for each pixel row, one first vertical charge transfer electrode 31 and one second vertical charge transfer electrode 32 are disposed.

Each first vertical charge transfer electrode 31 winds and extends along an upper-half periphery of the associated pixel row in the horizontal direction Dh.

Each second vertical charge transfer electrode 32 winds and extends, in the horizontal direction Dh, along a lower-half periphery of the associated pixel row.

Each first vertical charge transfer electrode 31 includes a polycrystalline silicon layer (1-polysilicon) formed as a first layer on the semiconductor substrate 1 with an electrically insulating layer, not shown, between the electrode 31 and the substrate 1. Each second vertical charge transfer electrode 32 includes a polycrystalline silicon layer (2-polysilicon) formed as a second layer on the semiconductor substrate 1 with an electrically insulating layer, not shown, therebetween. Each of the first and second vertical charge transfer electrodes 31 and 32 is coated with an electrically insulating layer, not shown.

In a gap defined or determined, for every second pixel column, by the first and second vertical charge transfer electrodes 31 and 32 corresponding to one pixel row, there is placed a light receiving section of a photodiode 3a or 3b of the pertinent pixel row in plan view.

As shown in FIG. 3, each first vertical charge transfer electrode 31 includes a first section 31a extending in the horizontal direction Dh and second to fourth sections 31b to 31d on the left side of the first section 31a. The sections 31b to 31d extend along an upper-half periphery of a photodiode 3a or 3b.

The second section 31b continuously extends from a left end section of the first section 31a such that centerlines respectively of the first and second sections 31a and 31b form an obtuse angle therebetween.

The third section 31c continues toward the left side of the second section 31b and extends from a left end section of the second section 31b in the horizontal direction Dh.

The fourth section 31d continuously extends from a left end section of the third section 31c such that centerlines respectively of the third and fourth sections 31c and 31d form an obtuse angle therebetween. The fourth section 31d includes a left end section continued to a right end section of another first section 31a separated on the left side of the pertinent first section 31a by one photodiode 3a or 3b in the horizontal direction Dh.

Each second vertical charge transfer electrode 32 includes a first section 32e extending in the horizontal direction Dh and second to fourth sections 32f to 32h on the left side of the first section 32e, the sections 32f to 32h extending along a lower-half periphery of a photodiode 3a or 3b.

The second section 32f continuously extends from a left end section of the first section 32e such that centerlines respectively of the first and second sections 32e and 32f form an obtuse angle therebetween.

The third section 32g continues to the second section 32f and extends from a left end section of the second section 32f in the horizontal direction Dh.

The fourth section 32h continuously extends from a left end section of the third section 32g such that centerlines respectively of the third and fourth sections 32g and 32h form an obtuse angle therebetween. The fourth section 32h includes a left end section continued to a right end section of another first section 32e separated on the left side of the pertinent first section 32e by one photodiode 3a or 3b in the horizontal direction Dh.

The second section 31b of the first vertical charge transfer electrode 31 and the second section 32f of the second vertical charge transfer electrode 32 extend in respective directions which are axially symmetric with respect to a virtual line extending in the horizontal direction Dh. Similarly, the fourth section 31d of the first electrode 31 and the fourth section 32h of the second electrode 32 extend respectively in axially symmetric directions.

As shown in FIG. 2, the readout gate region 21 is disposed on the right side of each of the photodiodes 3a and 3b. Assume that each readout gate region 21 is subdivided into two sub-regions, for example, sub-regions 21a and 21b respectively below the first and second vertical charge transfer electrodes 31 and 32. Either one of the readout sub-regions 21a and 21b is actually employed as a readout gate region. The readout sub-region 21a or 21b actually used as the readout gate region and the first or second vertical charge transfer electrode 31 or 32 thereover serves as a readout gate. In a readout operation, a readout pulse voltage is applied to first or second vertical charge transfer electrode 31 or 32 of the readout gate. Actually, the readout operation need only be conducted using a driver circuit, not shown.

As can be seen from FIG. 4, each of the vertical charge transfer paths 5a and 5b is not uniform in width. Namely, the width relatively varies depending on positions thereof. Assume that the relatively narrow width of the path is $W_1$ and the relatively wide width of the path is $W_2$.

In both vertical charge transfer paths 5a and 5b, the isolation area 15a or 15b is contiguous to the relatively narrow region thereof on one side (on the right side in FIG. 4). On the other side (on the left side in FIG. 4), none of the isolation areas 15a and 15b is formed. In the relatively wide region, the isolation area 15a is contiguous thereto on one side and the isolation area 15b is contiguous thereto on the other side.

Figure 5:
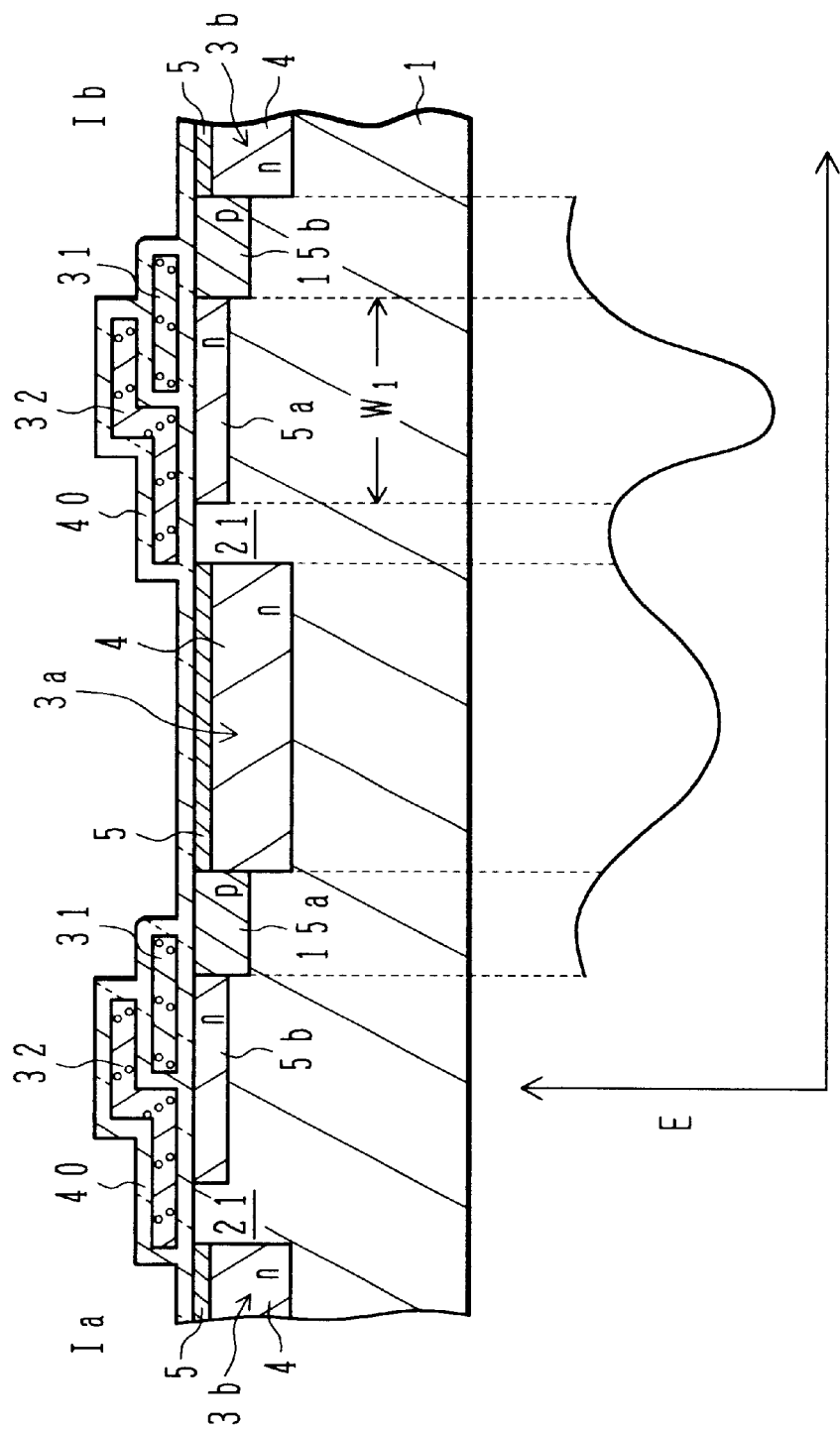
FIG. 5 is a diagram showing an outline of a cross section of the solid-state image pickup device along line Ia–Ib of FIG. 4 and an energy band corresponding thereto.

FIG. 5 shows an outline of a cross section along line Ia–Ib of the device shown in FIG. 4 and an energy band corresponding thereto. FIG. 5 shows the first and second vertical charge transfer electrodes 31 and 32, an electrically insulating layer arranged between these electrodes 31 and 32 and the semiconductor substrate 1, and an electrically insulating layer with which each of the electrodes 31 and 32 is coated. However, one electrically insulating layer 40 is representatively shown for these electrically insulating layers for simplicity of the diagram.

Figure 6:
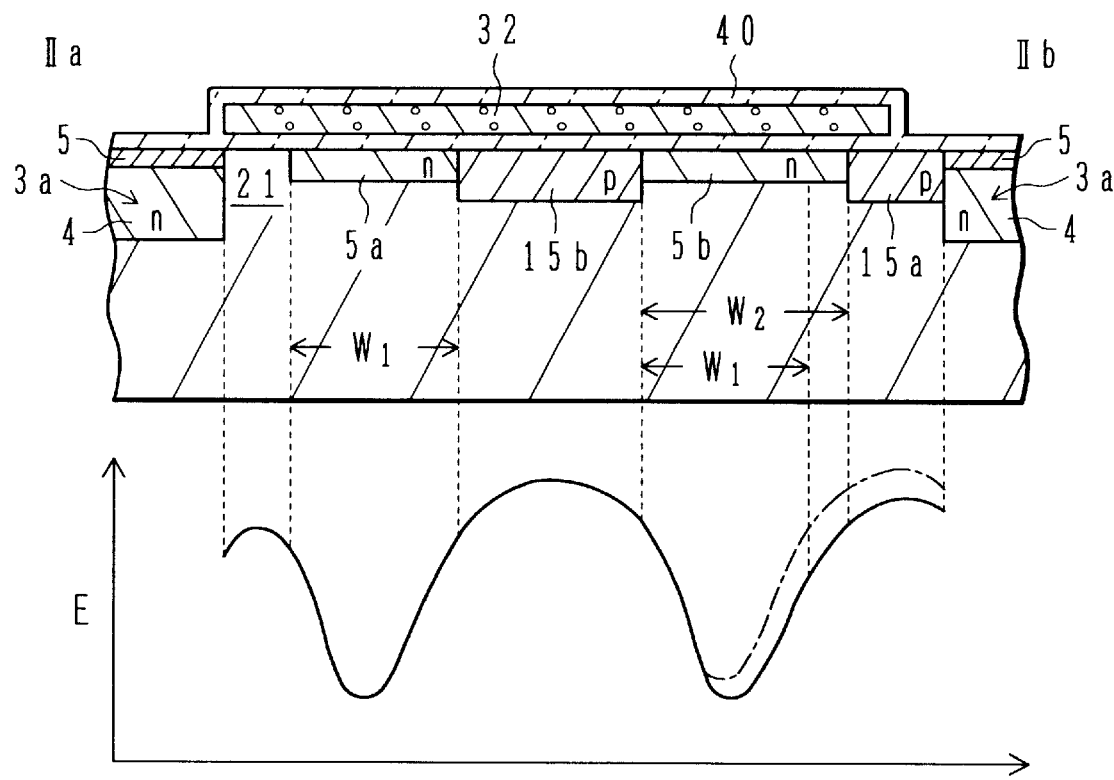
FIG. 6 is a diagram showing an outline of a cross section of the solid-state image pickup device along line IIa–IIb shown in FIG. 4 and an energy band corresponding thereto.

FIG. 6 shows an outline of a cross section along line IIa–IIb of the device shown in FIG. 4 and an energy band corresponding thereto. FIG. 6 shows the second vertical charge transfer electrode 32, an electrically insulating layer arranged between the electrode 32 and the semiconductor substrate 1, and an electrically insulating layer with op which the second electrodes 32 is coated. However, one electrically insulating layer 40 is representatively shown for these electrically insulating layers for simplicity of the diagram.

As shown in FIG. 5, in the cross section of the solid-state image pickup device 50 along line Ia–Ib of FIG. 4, the isolation area 15a is is disposed only on one side of the vertical charge transfer path 5b and the readout gate region 21 is arranged on the other side of the path 5b. Similarly, the isolation area 15b is disposed only on one side of the vertical charge transfer path 5a and the readout gate region 21 is arranged on the other side of the path 5a.

Each of the vertical charge transfer paths 5a and 5b has a width of $W_1$, for example, 1.0 micrometer ($\mu$m).

On the other hand, as can be seen from FIG. 6, in the cross section of the device 50 along line IIa–IIb of FIG. 4, the isolation areas 15a and 15b are disposed on the respective sides of the vertical charge transfer path 5b. The isolation area 15b is placed between the vertical charge transfer path 5b and the vertical charge transfer path 5a adjacent thereto on the left side. The readout gate region 21 is arranged on the left side of the vertical charge transfer path 5a.

In this structure, the vertical charge transfer path 5a has a width of $W_1$ and the vertical charge transfer path 5b has a width of $W_2$. The width of $W_2$ is, for example, 1.2 $\mu$m.

If the width $W_2$ of the vertical charge transfer path 5b shown in FIG. 6 is set to 1.0 $\mu$m, i.e., if $W_2=W_1$, there is obtained potential energy as drawn by a chain line in FIG. 6. Since the p-type semiconductor layers (isolation areas) 15a and 15b having a high impurity concentration exist on the respective sides of the vertical charge transfer path (n-type semiconductor layer) 5b, a depletion layer extends into the path 5b from both sides thereof. Namely, even when the width $W_2$ of the vertical charge transfer path 5b is equal to the width $W_1$ of the vertical charge transfer path 5a, i.e., equal to 1.0 $\mu$m, the width of an effective potential well is narrowed in the path 5b and its depth is also reduced. This indicates occurrence of the so-called narrow channel effect.

To overcome this difficulty, the width $W_2$ of the vertical charge transfer path 5b is set to be greater than the width $W_1$ of the vertical charge transfer path 5a as shown in FIG. 6 such that the effective width of the vertical charge path width is at a substantially constant value throughout the vertical charge transfer path 5b and between the vertical charge transfer paths 5a and 5b in consideration of the influence of the narrow channel effect.

When the vertical charge transfer paths 5a and 5b are fabricated by ion implantation using a mask made of, for example, photo resist, the width of each of the paths 5a and 5b can be controlled by appropriately selecting a width of an opening of the photo resist. A ratio of the width $W_1$ to the width $W_2$, namely, $W_1/W_2$ can be selected in a range from about 0.8 to a value less than about 1.0.

In the solid-state image pickup device 50, since the effective width of the vertical charge path width is at a substantially constant value throughout the respective vertical charge transfer paths 5a and 5b and between the vertical charge transfer paths 5a and 5b in consideration of the influence of the narrow channel, the local variation 4:0 of the transfer efficiency and the saturation output of charge can be prevented in the vertical charge transfer paths 5a and 5b. Charge accumulated in each photodiodes 10 can be therefore transferred in a stable state.

Specifically, the widths $W_1$ and $W_2$ of the vertical charge transfer paths 5a and 5b are set as follows.

$$W_2 - W_1 = (2\epsilon_s \epsilon_0 / eN_d)^{0.5} \{[V_{d2} N_{a2}/(N_{a2}+N_d)] - [V_{d1} N_{a1}/(N_{a1}+N_d)]\}^{0.5}$$

wherein, $\epsilon_s$ indicates semiconductor permittivity of the vertical charge transfer paths 5a and 5b and the isolation areas 15a and 15b, $\epsilon_0$ is free space permittivity, $eV_{d1}$ is discrepancy between work functions respectively of the n-type semiconductor layer (the vertical charge transfer paths 5a and 5b) and a p-type semiconductor layer (readout gate region 21) with a low impurity concentration before these layers are coupled with each other to form a junction therebetween, $eV_{d2}$ is discrepancy between work functions respectively of the n-type semiconductor layer (the vertical charge transfer paths 5a and 5b) and a p-type semiconductor layer (isolation areas 15a and 15b) with a high impurity concentration before these layers are coupled with each other to form a junction therebetween, and e indicates electric charge of an electron.

$N_d$ indicates impurity concentration of the vertical charge transfer paths 5a and 5b including the n-type semiconductor layer. $N_{a2}$ is impurity concentration of the p-type semiconductor layer with a high impurity concentration, namely, a p-type impurity concentration of the isolation areas 15a and 15b. It is assumed that the n-type impurity concentration of the vertical charge transfer path is constant in vertical charge transfer paths 5a and 5b and the p-type impurity concentration of the isolation areas is fixed in the isolation areas 15a and 15b.

$N_{a1}$ indicates impurity concentration of the p-type semiconductor layer with a low impurity concentration, i.e., of the readout gate region 21. The impurity concentration of the n-type semiconductor layer (vertical charge transfer paths 5a and 5b) is smaller than that of the isolation areas 15a and 15b, and hence it is assumed that the depletion layer extends almost into the n-type semiconductor layer. It is assumed that the p-n junction is an abrupt junction and no voltage is applied across the junction.

For example, the width $W_1$ is determined conforming to design rules including performance of the device and device manufacturing techniques, and the width $W_2$ is calculated using the formula above.

Even if device parameters such as $W_1$, $N_d$, $N_{a2}$, and $N_{a1}$, are different from those above, the widths $W_1$ and $W_2$ can be obtained through calculation.

The solid-state image pickup device 50 described above can be used as an area image sensor. In such a case, a light shielding film is arranged to prevent unnecessary photoelectric conversion in an area other than the photodiodes. To enhance light utilization efficiency of the photodiodes, one microlens and/or one inner lens are/is disposed over each photodiode depending on cases. In a solid-state image pickup device for color images, there may be arranged a color filter between the photodiode and the microlens corresponding thereto.

Figure 7:
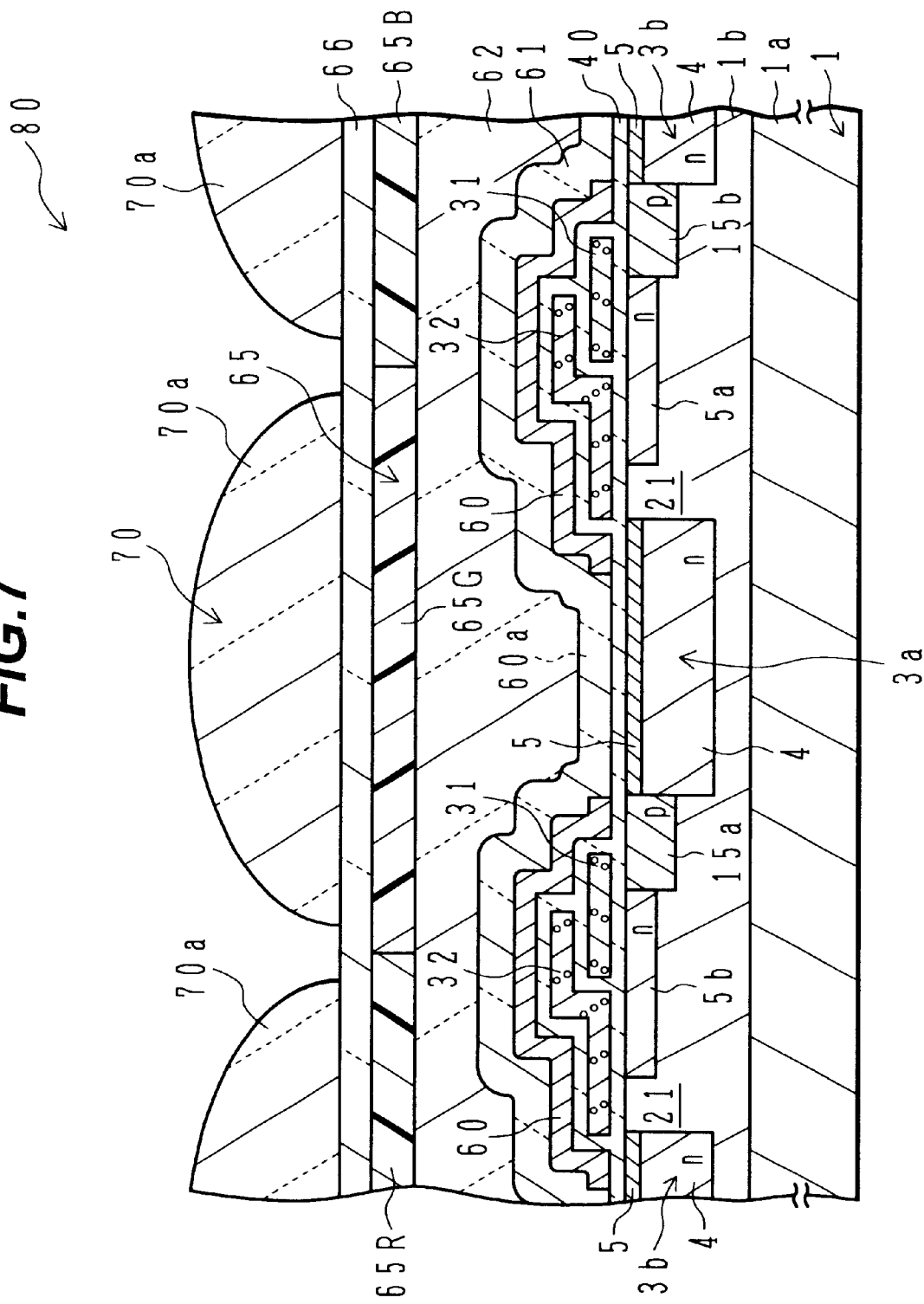
FIG. 7 is a cross-sectional diagram illustratively showing a solid-state image pickup device for producing color images, according to an embodiment.

FIG. 7 illustratively shows a cross-sectional view of an embodiment of a solid-state image pickup device for producing color images. The configuration of FIG. 7 includes a solid-state image pickup device 80, which is considerably different from the solid-state image pickup device 50 shown in FIGS. 1 to 6 by including a light shielding film 60, a color filter array 65, and a microlens array 70. The device 80 further differs from the device 50 in that the semiconductor substrate 1 includes an n-type semiconductor substrate 1a and a p-type semiconductor well 1b formed on one surface side of the substrate 1a.

Excepting these differences, the devices 80 and 50 are similarly configured. In FIG. 7, the same constituent components as those of FIG. 5 or 6 are assigned with the same reference numerals used in FIG. 5 or 6 and duplicated description thereof will be avoided.

In the solid-state image pickup device 80, the semiconductor substrate 1 is covered with the light shielding film 60 including an opening 60a over each of the photodiodes 3a and 3b. The film 60 thereby prevents unnecessary photoelectric conversion in an area other than the photodiodes 3a and 3b.

The light shielding film 60 is a thin film of metal such as aluminum, chromium, tungsten (wolfram), titanium, or molybdenum or a thin film of an alloy including two kinds of these metals. Alternatively, the film 60 is a multilayer metallic thin film including at least two kinds of items selected from a group including these metals or from a group including the metals and the alloys.

The device 80 further includes a passivation film 61 fabricated on the light shielding film 60 and on an exposed section of an electrically insulating layer 40 in each opening 60a. The passivation film 61 is fabricated using silicon nitride, silicon oxide, or the like.

Disposed on the passivation film 61 is a first planarizing film 62. The film 62 also serves as a layer to adjust focus of the microlens. When necessary, an inner lens is formed in the first planarizing film 62.

The first planarizing film 62 is manufactured by forming a coating with desired thickness of a transparent resin such as photo resist, for example, in a spin coating process.

The device 80 further includes a color filter array 65 including a predetermined number of color filters on the first planarizing film 62. The filter array 65 includes a plurality of types of color filters. There exist color filter arrays of three-primary-color type associated with red, green, and blue and those of complementary color type.

In either type of color filter arrays, one color filter is arranged over each of the photodiodes 3a and 3b. The device 80 of FIG. 7 includes one red color filter 65R, one green filter 65G, and one blue filter 65B.

The color filter array 65 can be disposed by forming layers of resins (color resins) each of which including, for example, pigment or dye of a desired color by photolithography or the like.

Disposed on the color filter array 65 is a second planarizing film 66. The film 66 can be disposed by forming a coating of desired thickness of transparent resin such as photo resist, for example, in a spin coating process.

The microlens array 70 is arranged on the second planarizing film 66. The array 70 includes a large number of microlenses 70a. One microlens 70a is disposed over each photodiode 3a and 3b.

The microlens array 70 is formed as follows. A layer of transparent resin (such as photo resist) having a refractive index of, for example, about 1.3 to about 2.0 is manufacture in a predetermined contour including a plurality of sections by photolithography or the like. The transparent resin of each section is then molten by heat treatment to obtain rounded corners in each section by surface tension of the molten resin. Each section is then cooled down to resultantly obtain the microlens array 70.

Generally, the solid-state image pickup devices scan pixels in various ways using interlaced scanning, progressive scanning, and quarter thin-out scanning.

To transfer charge read out from a photodiode to the vertical charge transfer path to the horizontal charge transfer path, there have been known various methods such as a three-phase drive method, a four-phase drive method, an eight-phase drive method, and the like.

According to the scanning method and the drive method employed, the number of vertical charge transfer electrodes necessary for each pixel row varies, for example, is two, three, and four. Therefore, the number of vertical charge transfer electrodes to be arranged per pixel row can be appropriately selected according to the pixel scanning method and the drive method for the charge transfer operation.

Figure 8:
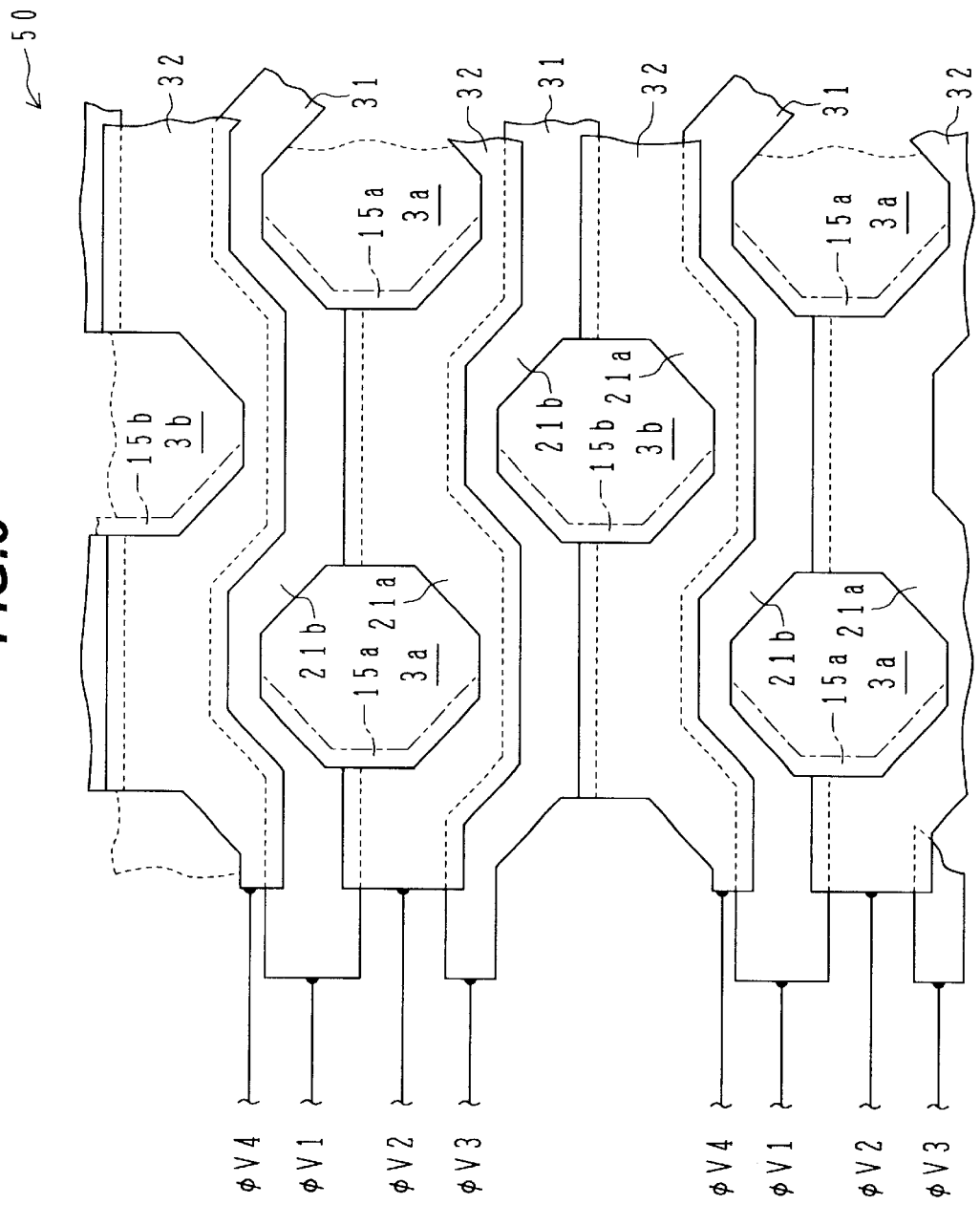
FIG. 8 is a plan view showing an example of arrangement of wiring to transfer charge read out to a vertical charge path to a horizontal charge transfer path in the solid-state image pickup device of the first embodiment.
Figure 9:
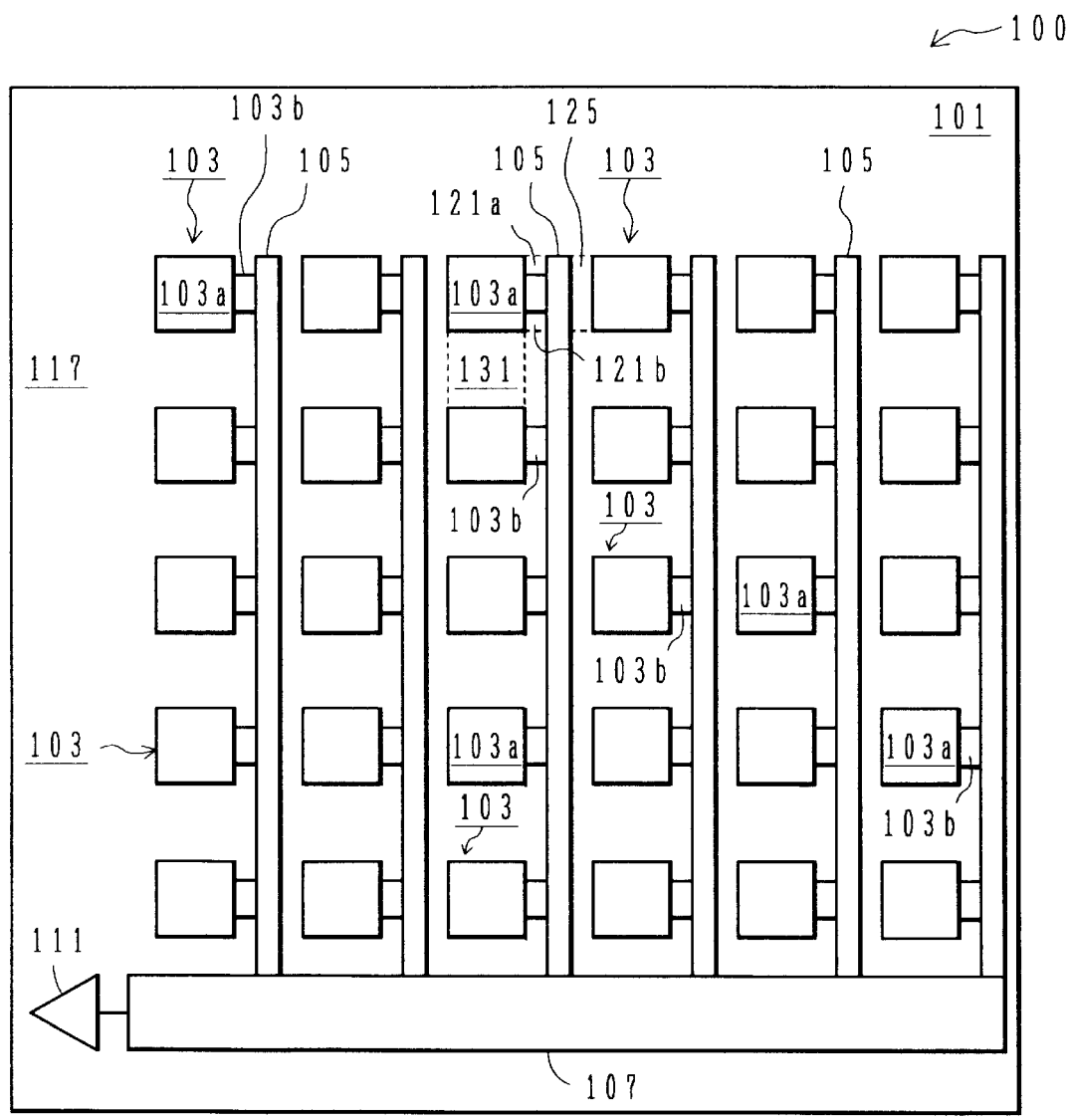
FIG. 9 is a plan view schematically showing a solid-state image pickup device of the prior art.

FIG. 8 shows a wiring example in the solid-state image pickup device 50 in which charge read out to the vertical charge transfer path 5a, 5b is transferred to the horizontal charge transfer path 7 using four-phase drive signals $\phi V1$, $\phi V2$, $\phi V3$, and $\phi V4$.

The vertical charge transfer electrodes 31 and 32 are classified into four groups, which are respectively supplied with the different drive signals $\phi V1$ to $\phi V4$. On of the groups includes every fourth vertical charge transfer electrodes 31 or 32.

For example, when the readout gate includes a vertical charge transfer electrode 32 and a readout gate sub-region 21a therebelow, the readout pulse is superimposed onto the drive signals $\phi V2$ and $\phi V4$. When the readout gate includes a vertical charge transfer electrode 31 and a readout gate sub-region 21b therebelow, the readout pulse is superimposed onto the drive signals $\phi V1$ and $\phi V3$.

When the readout pulse (of, for example, 15 V) is applied to the vertical charge transfer electrode of the readout gate, potential of the vertical charge transfer path 5a or 5b and potential of the readout gate sub-regions 21a or 21b below the electrode are lowered by capacitive coupling. Between the photodiodes 3a and 3b and the vertical charge transfer electrodes 31 and 32, there does not positively appear capacitive coupling, and hence potential of the photodiodes 3a and 3b little changes.

Therefore, it is possible to set the potential of the vertical charge transfer path 5a or 5b and potential of the readout gate sub-regions 21a or 21b to be lower than the potential of the photodiodes 3a and 3b.

Charge stored in the photodiodes 3a and 3b can be read out via the readout gate to the associated vertical charge transfer path 5a or 5b.

By applying a relatively high-level voltage (e.g., 0 V) to the vertical charge transfer electrode 31 or 32, a potential well can be formed in the vertical charge transfer path 5a or 5b below the vertical charge transfer electrode 31 or 32. By applying a relatively low-level voltage (e.g., -8 V) to the vertical charge transfer electrode 31 or 32, a potential barrier can be formed in the vertical charge transfer path 5a or 5b below the vertical charge transfer electrode 31 or 32. Charge in the vertical charge transfer path 5a and 5b can transferred to the horizontal charge transfer path 7 by appropriately controlling the voltage applied to the vertical charge transfer electrodes 31 and 32.

A plurality of horizontal charge transfer electrodes are formed on the horizontal charge transfer path 7 with an electrically insulating layer therebetween. For example, four horizontal charge transfer electrodes are arranged for each of the vertical charge transfer paths 5a and 5b. Each horizontal charge transfer electrode intersects, in plan view, the horizontal charge transfer path 7 in a direction of width thereof (line width). Charge in the horizontal charge transfer path 7 can be transferred to the output amplifier 11 by applying a predetermined drive signal to each horizontal charge transfer electrode.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

I claim:

1. A solid-state image pickup device, comprising:

a semiconductor substrate having a two-dimensional surface;

a large number of photoelectric converter elements including a semiconductor region of first conductivity type, said photoelectric converter elements being arranged on the surface of said semiconductor substrate in a plurality of columns with a fixed pitch and a plurality of rows with a fixed pitch, said photoelectric converter elements in each odd column being shifted about one half of the pitch in each said column relative to said photoelectric converter elements in each even column, said photoelectric converter elements in each odd row being shifted about one half of the pitch in each said row relative to said photoelectric converter elements in each even row, each said photoelectric converter element column including said photoelectric converter elements of only said odd rows or said even rows;

a plurality of isolation areas each formed on the surface of said semiconductor substrate between each pair of adjacent ones of said photoelectric converter element columns, each said isolation area including a semiconductor layer of second conductivity type generally extending in a direction of said photoelectric converter element column, while locally meandering;

a plurality of vertical charge transfer paths each formed between each said photoelectric converter element column and adjacent one of said isolation areas on one side of said photoelectric converter element column in a direction of said photoelectric converter element row, each said vertical charge transfer path including a semiconductor layer of first conductivity type generally extending in said photoelectric converter element column direction, while locally meandering, said vertical charge transfer path having width $W_1$ between each said photoelectric converter element of said column and said adjacent isolation area and width $W_2$ between said photoelectric converter elements adjacent to each other in said column, said width $W_2$ being larger than said width $W_1$; and a readout gate region disposed between each said photoelectric converter element and adjacent vertical charge transfer path, wherein said readout gate region includes a semiconductor layer of second conductivity type having an impurity concentration lower than an impurity concentration of said semiconductor layer of second conductivity to of said isolation area, wherein said widths $W_2$ and $W_1$ are related to each other to satisfy a relation:

$$W_2-W_1=(2\epsilon_s\epsilon_0/eN_d)^{0.5}\{[V_{d2}N_{a2}/(N_{a2}+N_d)]-[V_{d1}N_{a1}/(N_{a1}+N_d)]\}^{0.5}$$

wherein, $\epsilon_s$ indicates permittivity of said semiconductor layer, $\epsilon_0$ is free space permittivity, $eV_{d1}$ is discrepancy between work functions respectively of said semiconductor layer of first conductivity type and said semiconductor layer of second conductivity type of said readout gate region before said layers are coupled with each other to form a junction therebetween, $eV_{d2}$ is discrepancy between work functions respectively of said semiconductor layer of first conductivity type and said semiconductor layer of second conductivity type of said isolation area before said layers are coupled with each other to form a junction therebetween, and e indicates electric charge of an electron, $N_d$ indicates an impurity concentration of said semiconductor layer of first conductivity type, $N_{a2}$ is an impurity concentration of said semiconductor layer of second conductivity type of said isolation area, and $N_{a1}$ indicates an impurity concentration of said semiconductor layer of second conductivity type of said readout gate region.

2. A solid-state image pickup device according to claim 1, wherein said widths $W_1$ and $W_2$ are so selected that an effective vertical charge transfer path width of each said vertical charge transfer path is at a constant value throughout the vertical charge transfer path.

3. A solid-state image pickup device according to claim 1, wherein a ratio $W_1/W_2$ is equal to or more than 0.8 and less than 1.0.

4. A solid-state image pickup device according to claim 1, further comprising two vertical charge transfer electrodes provided for each said photoelectric converter element row.

5. A solid-state image pickup device, comprising:
   a semiconductor substrate having a two-dimensional surface;
   a large number of photoelectric converter elements arranged on the surface of said semiconductor substrate in a plurality of columns with a first pitch and a plurality of rows with a second pitch, said photoelectric converter elements in each odd column being shifted about one half of the second pitch relative to said photoelectric converter elements in each even column, said photoelectric converter elements in each odd row being shifted about one half of the first pitch relative to said photoelectric converter elements in each even row, each said photoelectric converter element column including said photoelectric converter elements of only said odd rows or said even rows;
   an isolation area formed on said semiconductor substrate on a predetermined first side of each associated photoelectric converter element column, said isolation area generally extending, while locally meandering, in a direction of said photoelectric converter element column;
   a vertical charge transfer path including a semiconductor layer of first conductivity type formed on said semiconductor substrate on a second side of each associated photoelectric converter element column, the second side being opposite to the first side, said semiconductor layer generally extending, while locally meandering, in a direction of said photoelectric converter element column, and being contiguous, in every regions between adjacent two of said photoelectric converter elements in said associated photoelectric converter element column, to said isolation area for the associated column while being contiguous to another said isolation area for the column next to the associated column on the second side, said semiconductor layer having width $W_1$ in a section in which said semiconductor layer is contiguous only to said another isolation area on the second side and width $W_2$ in a section in which said semiconductor layer is contiguous to said isolation area on the first side and said another isolation area on the second side, said width $W_2$ being larger than said width $W_1$; and
   a readout gate region disposed between each said photoelectric converter element and adjacent vertical charge transfer path, wherein said readout gate region includes a semiconductor layer of second conductivity type having an impurity concentration lower than an impurity concentration of said semiconductor layer of second conductivity type of said isolation area, wherein said widths $W_2$ and $W_1$ are related to each other to satisfy a relation:

$$W_2-W_1=(2\epsilon_s\epsilon_0/eN_d)^{0.5}\{[V_{d2}N_{a2}/(N_{a2}+N_d)]-[V_{d1}N_{a1}/(N_{a1}+N_d)]\}^{0.5}$$

wherein, $\epsilon_s$ indicates permittivity of said semiconductor layer, $\epsilon_0$ is free space permittivity, $eV_{d1}$ is discrepancy between work functions respectively of said semiconductor layer of first conductivity type and said semiconductor layer of second conductivity type of said readout gate region before said layers are coupled with each other to form a junction therebetween, $eV_{d2}$ is discrepancy between work functions respectively of said semiconductor layer of first conductivity type and said semiconductor layer of second conductivity type of said isolation area before said layers are coupled with each other to form a junction therebetween, and e indicates electric charge of an electron, $N_d$ indicates an impurity concentration of said semiconductor layer of first conductivity type, $N_{a2}$ is an impurity concentration of said semiconductor layer of second conductivity type of said isolation area, and $N_{a1}$ indicates an impurity concentration of said semiconductor layer of second conductivity type of said readout gate region.

6. A solid-state image pickup device according to claim 5, wherein each said isolation area includes a semiconductor layer of second conductivity type opposite to said first conductivity type.

7. A solid-state image pickup device according to claim 5, wherein said widths $W_1$ and $W_2$ are so selected that an effective vertical charge transfer path width of each said vertical charge transfer path is at a constant value throughout the vertical charge transfer path.

8. A solid-state image pickup device according to claim 5, wherein:
   each said isolation area includes a semiconductor layer of second conductivity type opposite to said first conductivity type.

9. A solid-state image pickup device according to claim 5, wherein a ratio $W_1/W_2$ is equal to or more than 0.8 and less than 1.0.

10. A solid-state image pickup device according to claim 5, further comprising two vertical charge transfer electrodes provided for each said photoelectric converter element row.

11. A solid-state image pickup device according to claim 1, wherein said semiconductor substrate includes a well of said second conductivity type, in which the semiconductor regions of the photoelectric converter elements are formed.

12. A solid-state image pickup device according to claim 5, wherein said semiconductor substrate includes a well of said second conductivity type, in which the semiconductor regions of the photoelectric converter elements are formed.

13. A solid-state image pickup device, comprising:

a semiconductor substrate having a two-dimensional surface;

a large number of photoelectric converter elements including a semiconductor region of first conductivity type, said photoelectric converter elements being arranged on the surface of said semiconductor substrate in a plurality of columns with a fixed pitch and a plurality of rows with a fixed pitch, said photoelectric converter elements in each odd column being shifted about one half of the pitch in each said column relative to said photoelectric converter elements in each even column, said photoelectric converter elements in each odd row being shifted about one half of the pitch in each said row relative to said photoelectric converter elements in each even row, each said photoelectric converter element column including said photoelectric converter elements of only said odd rows or said even rows;

a plurality of isolation areas each formed on the surface of said semiconductor substrate between each pair of adjacent ones of said photoelectric converter element columns, each said isolation area including a semiconductor layer of second conductivity type generally extending in a direction of said photoelectric converter element column, while locally meandering; and a plurality of vertical charge transfer paths each formed between each said photoelectric converter element column and adjacent one of said isolation areas on one side of said photoelectric converter element column in a direction of said photoelectric converter element row, each said vertical charge transfer path including a semiconductor layer of first conductivity type generally extending in said photoelectric converter element column direction, while locally meandering, said vertical charge transfer path having regions with width $W_1$ between each said photoelectric converter element of said column and said adjacent isolation area and regions with width $W_2$ between adjacent ones of said isolation areas sandwiching said photoelectric converter element column, said width $W_2$ being larger than said width $W_1$.

14. A solid-state image pickup device according to claim 13, wherein said widths $W_1$ and $W_2$ are so selected that an effective vertical charge transfer path width of each said vertical charge transfer path is at a constant value throughout the vertical charge transfer path.

15. A solid-state image pickup device according to claim 13, further comprising a readout gate region disposed between each said photoelectric converter element and adjacent vertical charge transfer path, wherein said readout gate region includes a semiconductor layer of second conductivity type having an impurity concentration lower than an impurity concentration of said semiconductor layer of second conductivity type of said isolation area.

16. A solid-state image pickup device according to claim 13, wherein a ratio $W_1/W_2$ is equal to or more than 0.8 and less than 1.0.

17. A solid-state image pickup device according to claim 13, further comprising two vertical charge transfer electrodes provided for each said photoelectric converter element row.

* * * * *